United States Patent
Kwon et al.

(10) Patent No.: US 7,888,226 B2
(45) Date of Patent: Feb. 15, 2011

(54) METHOD OF FABRICATING POWER SEMICONDUCTOR DEVICE FOR SUPPRESSING SUBSTRATE RECIRCULATION CURRENT

(75) Inventors: Tae-hun Kwon, Seoul (KR); Cheol-joong Kim, Gyeonggi-do (KR); Young-sub Jeong, Gyeonggi-do (KR)

(73) Assignee: Fairchild Korea Semiconductor, Ltd., Bucheon (KR)

( * ) Notice: Subject to any disclaimer, the term of this patent is extended or adjusted under 35 U.S.C. 154(b) by 241 days.

(21) Appl. No.: 12/229,019

(22) Filed: Aug. 18, 2008

(65) Prior Publication Data
US 2008/0318401 A1    Dec. 25, 2008

Related U.S. Application Data

(62) Division of application No. 11/123,400, filed on May 6, 2005, now Pat. No. 7,420,260.

(30) Foreign Application Priority Data

May 8, 2004    (KR) ..................... 10-2004-0032494

(51) Int. Cl.
  *H01L 21/331* (2006.01)
(52) U.S. Cl. .................. 438/373; 438/369; 438/370; 438/372; 438/E21.473
(58) Field of Classification Search .................. None
See application file for complete search history.

(56) References Cited

U.S. PATENT DOCUMENTS

| | | | |
|---|---|---|---|
| 5,179,432 A * | 1/1993 | Husher | ................ 257/593 |
| 5,246,871 A * | 9/1993 | Zambrano et al. | ........... 438/189 |
| 5,541,123 A | 7/1996 | Williams et al. | |
| 5,541,125 A | 7/1996 | Williams et al. | |
| 5,547,880 A | 8/1996 | Williams et al. | |
| 5,559,044 A | 9/1996 | Williams et al. | |
| 5,583,061 A | 12/1996 | Williams et al. | |
| 5,618,743 A | 4/1997 | Williams et al. | |
| 5,643,820 A | 7/1997 | Williams et al. | |
| 5,648,281 A | 7/1997 | Williams et al. | |
| 5,973,366 A | 10/1999 | Tada | |

* cited by examiner

*Primary Examiner*—Dung A. Le
(74) *Attorney, Agent, or Firm*—Sidley Austin LLP (57) ABSTRACT

A power semiconductor device has a first region in which a transistor is formed, a third region in which a control element is formed, and a second region for separating the first region and the third region. The power semiconductor device includes a substrate of a first conductive type and a semiconductor region of a second conductive type arranged on the substrate, and a highly-doped buried layer of the second conductive type and a highly-doped bottom layer of the first conductive type are arranged between the substrate and the semiconductor region, and the first highly-doped bottom layer of the first conductive type is arranged on a top side and a bottom side of the highly-doped buried layer in the first region and extends by a predetermined distance to the second region, and a first isolation region is arranged on the highly-doped bottom layer extending from the first region in the second region, and a highly-doped region of the second conductive type is arranged on the highly-doped buried layer, and a second isolation region is arranged on a second highly-doped bottom layer of the first conductive type . By such structure, parasitic bipolar junction transistors in the first isolation region and the second isolation region can be electrically separated from the third region.

6 Claims, 11 Drawing Sheets

FIG. 12

METHOD OF FABRICATING POWER SEMICONDUCTOR DEVICE FOR SUPPRESSING SUBSTRATE RECIRCULATION CURRENT

CROSS REFERENCE TO RELATED APPLICATION

The present application is a divisional of co-pending application Ser. No. 11/123,400, filed May 6, 2005, which claims the priority of Korean Patent Application No. 10-2004-0032494, filed on May 8, 2004 in the Korean Intellectual Property Office, the content of which is incorporated herein by reference in its entirety.

BACKGROUND OF THE INVENTION

1. Field of the Invention

The present invention relates to power semiconductor devices, and more particularly, to a power semiconductor device for suppressing substrate recirculation current and a method of fabricating the power semiconductor device.

2. Description of the Related Art

Generally, transient biasing conditions may occur in operations of power semiconductor devices, resulting in an undesirable recirculation current that could flow into the substrates. In some cases, the substrate recirculation current may influence currents of other regions isolated by reverse-biased pn-junctions. The substrate recirculation current mainly occurs by turn-on of a parasitic transistor.

SUMMARY OF THE INVENTION

In one embodiment of the present invention, a power semiconductor device is provided which is capable of suppressing a current flowing from a control unit separated by a junction isolation to a transistor unit MOS during operation of a parasitic transistor.

In another embodiment of the present invention, a method is provided of fabricating the power semiconductor device.

According to one embodiment of the present invention, a power semiconductor device comprises one or more regions. These regions may include a first region in which a transistor is formed, a third region in which a control element is formed, and a second region arranged between the first region and the third region to electrically separate the transistor from the control element. The semiconductor device may further comprise: a substrate of a first conductive type; a semiconductor region of a second conductive type arranged on the substrate; a highly-doped buried layer of a second conductive type arranged in the first region and the third region between the substrate and the semiconductor regions, the highly-doped buried layer of the second conductive type extending by a predetermined distance from the first region to the second region; a highly-doped bottom layer of the first conductive type which may comprise a first highly-doped bottom layer of the first conductive type arranged on a top side and a bottom side of the highly-doped buried layer in the first region and extending by a predetermined distance from the first region to the second region, and a second highly-doped bottom layer of the first conductive type separated by a predetermined distance from the highly-doped bottom layer to the second region; an isolation region which may comprise a first isolation region arranged to contact with an upper portion of the first highly-doped bottom layer of the first conductive type, and a second isolation region arranged to make contact with an upper portion of the second highly-doped bottom layer of the first conductive type in the semiconductor region of the second region; and a highly-doped region of the second conductive type arranged to make contact with an upper portion of the highly-doped buried layer of the second conductive type between the first isolation region and the second isolation region in the semiconductor region of the second region.

In one embodiment, the highly-doped buried layer of the second conductive type may be longer than the highly-doped bottom layer of the first conductive type in the second region.

In one embodiment, a DMOS (double diffused MOS) transistor may be arranged on the first highly-doped bottom layer of the first conductive type in the first region.

In another embodiment, the DMOS transistor may comprise a well region of a second conductive type arranged on the first highly-doped bottom layer of the first conductive type; a body region of the first conductive type formed on an upper surface of the well region; a drain region separated by a predetermined distance from the body region on an upper surface of the well region; a source region arranged in the body region; a gate insulating layer arranged on a channel forming region of the body region; and a gate conductive layer arranged on the gate insulating layer.

In one embodiment, the first highly-doped bottom layer of the first conductive type, the highly-doped region of the second conductive type, and the second highly-doped bottom layer of the first conductive type may be connected to a ground terminal.

In another embodiment, the impurity density in the highly-doped bottom layer of the second conductive type extending from the first region to the second region may be in a range of $1 \times 10^{19}/cm^3$ to $9 \times 10^{19}/cm^3$.

The first conductive type may be p type, and the second conductive type may be n type.

According to another embodiment, a method of fabricating a power semiconductor device which may comprise one or more regions is provided. The regions in such a power semiconductor device may include: a first region in which a transistor is formed, a third region in which a control element is formed, and a second region arranged between the first region and the third region to electrically separate the transistor from the control element. The method of fabricating such a power semiconductor device may comprise, among others, the following: forming a first mask layer pattern covering a partial surface of the second region adjacent to the third region on a substrate of a first conductive type; implanting impurity ions of a second conductive type on the substrate with a first ion implantation process using the first mask layer pattern as an ion implantation mask; forming a highly-doped buried layer of the second conductive type arranged in the first region and the third region and extending by a predetermined distance of the second region from the first region by removing the first mask layer pattern and diffusing the implanted impurity ions; forming a second mask layer pattern to expose a surface of the first region and a surface of a portion where the highly-doped buried layer is not formed in the second region, on the substrate; implanting impurity ions of the first conductive type on the substrate with the second ion implantation process using the second mask layer pattern as an ion implantation mask; forming a first highly-doped bottom layer of the first conductive type arranged in the first region and the third region and extending by a predetermined distance of the second region from the first region by removing the first mask layer pattern and diffusing the implanted impurity ions and a second highly-doped bottom layer of the first conductive type separated by a predetermined distance from the highly-doped buried layer in the second region; and forming a semiconductor region on the substrate.

In one embodiment, an arsenide (As) or antimony (Sb) ion may be used as the impurity ion of the second conductive type.

In another embodiment, a boron (B) ion may be used as the impurity ion of the first conductive type.

In one embodiment, the impurity density of the impurity ion of the second conductive type may be in a range of $1 \times 10^{19}/cm^3$ to $9 \times 10^{19}/cm^3$.

In another embodiment, a method of fabricating a power semiconductor device may further comprise forming the first highly-doped isolation region of a first conductive type to make contact with an upper portion of the first highly-doped bottom layer of the first conductive type and the second highly-doped isolation region of the first conductive type to make contact with an upper portion of the second highly-doped bottom layer of the first conductive type in the second region; and forming the highly-doped region of a second conductive type to contact with an upper portion of the highly-doped buried layer of the second conductive type in the second region.

The first conductive type may be p type, and the second conductive type may be n type.

Important technical advantages of the present invention are readily apparent to one skilled in the art from the following figures, descriptions, and claims.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The embodiments of the present invention and their advantages are best understood by referring to FIGS. 1 through 12 of the drawings. Like numerals are used for like and corresponding parts of the various drawings.

Figure 1:
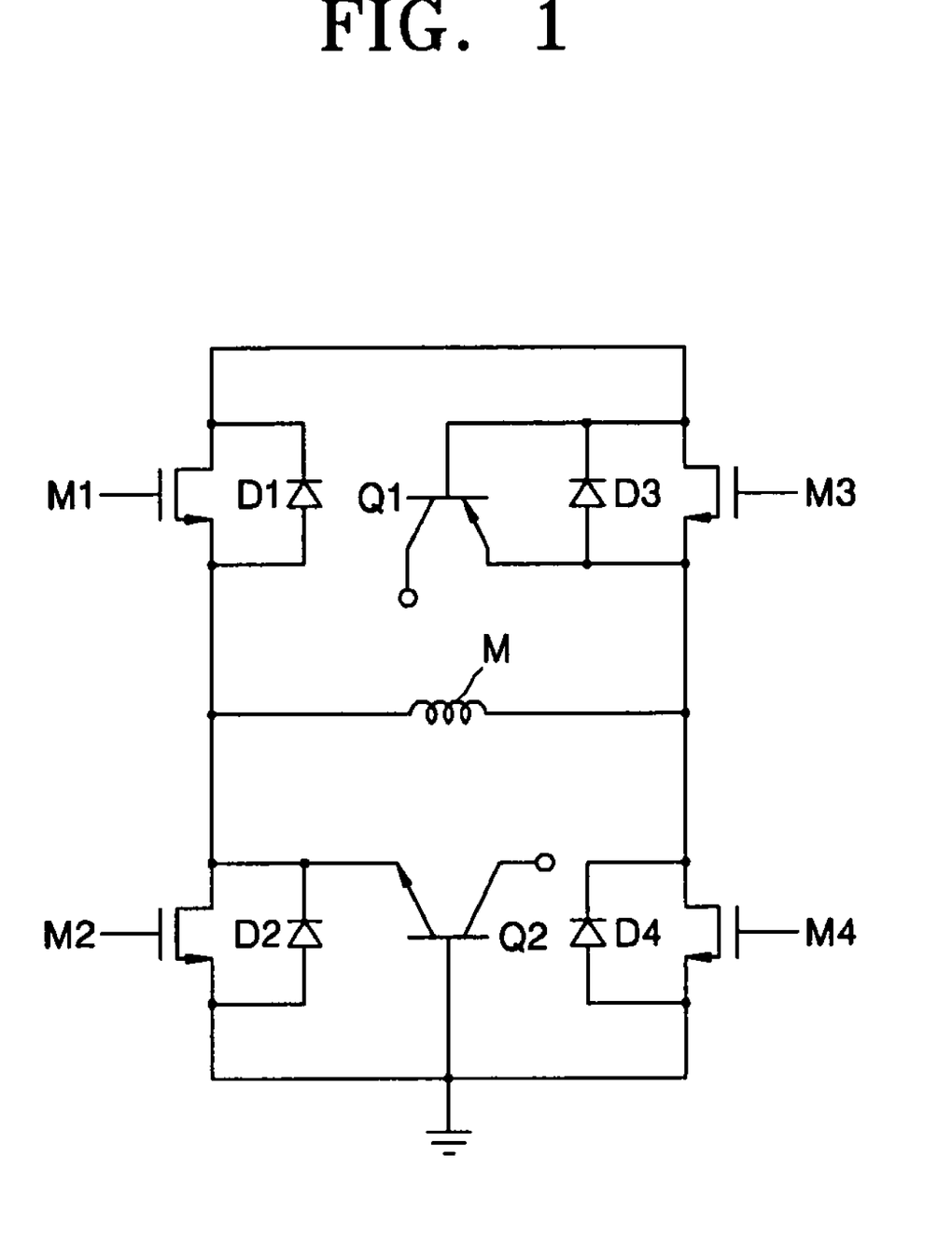
FIG. 1 is a circuit diagram of a typical transistor bridge having an inductive load.

FIG. 1 is a circuit diagram of a general transistor bridge having an inductive load.

The transistor bridge is arranged between a direct current bias terminal Vdd and a ground terminal, and supplies an alternating current to the inductive load M such as a motor. Transistors M1, M2, M3, and M4 of FIG. 1 are power transistors, which could be, for example, DMOS (double diffused MOS) transistors. Each of these transistors M1, M2, M3, and M4 has a responsive diode D1, D2, D3, or D4. Each of the diodes D1, D2, D3, and D4 serves as a recovery diode.

As is well known in the art, transistor bridges typically operate as follows: when diagonally disposed transistors M1 and M4 (or M2 and M3) in the transistor bridge are alternately switched on or off, currents in opposite directions are repeatedly applied to the inductive load M. During the switching operation, a parasitic transistor may be operated. The operation of the parasitic transistor generates a substrate recirculation current, which could lead to various problems. These various problems will be described in detail with reference to the accompanying drawings.

Figure 2A:
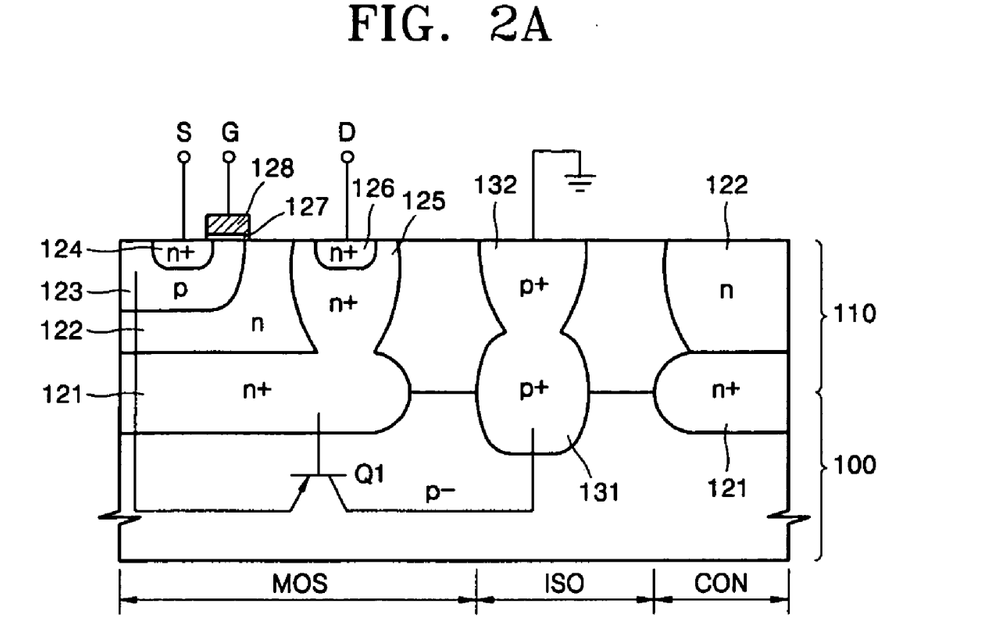
FIGS. 2A and 2B are sectional views illustrating two transistor structures of the transistor bridge of FIG. 1.
Figure 2B:
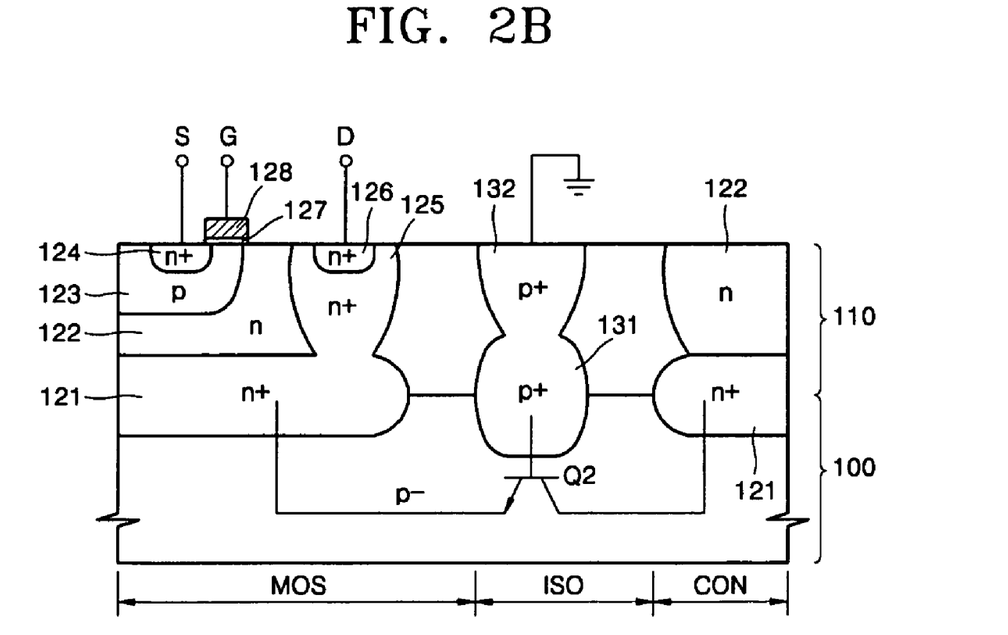

FIGS. 2A and 2B are sectional views illustrating two transistor structures of the transistor bridge of FIG. 1. A transistor of FIG. 2A is an upper transistor M1 or M3, and a transistor of FIG. 2B is a lower transistor M2 or M4.

Referring to FIG. 2A and 2B, an epitaxial layer 110 is arranged on a p⁻ type substrate 100 having a transistor unit MOS, an isolating unit ISO, and a control unit CON. An n⁺ type buried layer 121 and a p⁺ type bottom layer 131 are arranged on a junction portion of the p⁻ type substrate 100 and the epitaxial layer 110. The n⁺ type buried layer 121 is formed in the transistor unit MOS and the control unit CON, and the p⁺ type bottom layer 131 is formed in the isolating unit ISO.

In the transistor unit MOS, an n type well region 122 is arranged on the n⁺ type buried layer 121, and an n⁺ type sink region 125 surrounds the n type well region 122. The bottom of the n⁺ type sink region 125 makes contact with the upper surface of the n⁺ type buried layer 121. A p type body region 123 is formed in a region on the n type well region 122. An n⁺ type source region 124 is arranged in a region on the p type body region 123. A gate insulating layer 127 and a gate conductive layer 128 are sequentially arranged on a channel forming region of the p type body region 123 surrounding the n⁺ type source region 124. Further, an n⁺ type drain region 126 is arranged on the n⁺ type sink region 125. The n⁺ type source region 124, the n⁺ type drain region 126, and the gate conductive layer 128 are connected to a source terminal S, a drain terminal D, and a gate terminal G through metal interconnection lines, respectively.

In the isolating unit ISO, a p⁺ type isolation region 132 is arranged on the p⁺ type bottom layer 131. The bottom of the p⁺ type isolation region 132 makes contact with the upper surface of the p⁺ type bottom layer 131. The p⁺ type isolation region 132 is connected to the ground terminal. In the control unit CON, the n type well region 122 is arranged on the n⁺ type buried layer 121. Although not shown in the drawings, several diffusion areas constituting control elements can be arranged in the n type well region 122.

In the transistor bridge of FIG. 1, which consists of transistors having the aforementioned structure, it is possible for the upper transistor M1 and the lower transistor M4 to turn off before the upper transistor M3 and the lower transistor M2 turn on. In the upper transistor M1, the diode D1 of FIG. 1 is biased in a forward direction, so that a current flows from the source terminals to the drain terminals. At the same time, as shown in FIG. 2A, a pnp type parasitic bipolar junction transistor Q1 turns on, so that the substrate recirculation current flows into the p⁻ type substrate 100. In the lower transistor M4, a diode D4 of FIG. 1 is biased in a forward direction, so that a current flows from the source terminals to the drain terminals. At the same time, as shown in FIG. 2B, an npn type parasitic bipolar junction transistor Q2 turns on, so that a current from the control unit CON flows to the drain terminal D through the substrate 100. Since a current from the control unit CON undesirably flows to the transistor unit MOS through the substrate 100, control operations may be unable to function normally in the control unit CON.

Figure 3A:
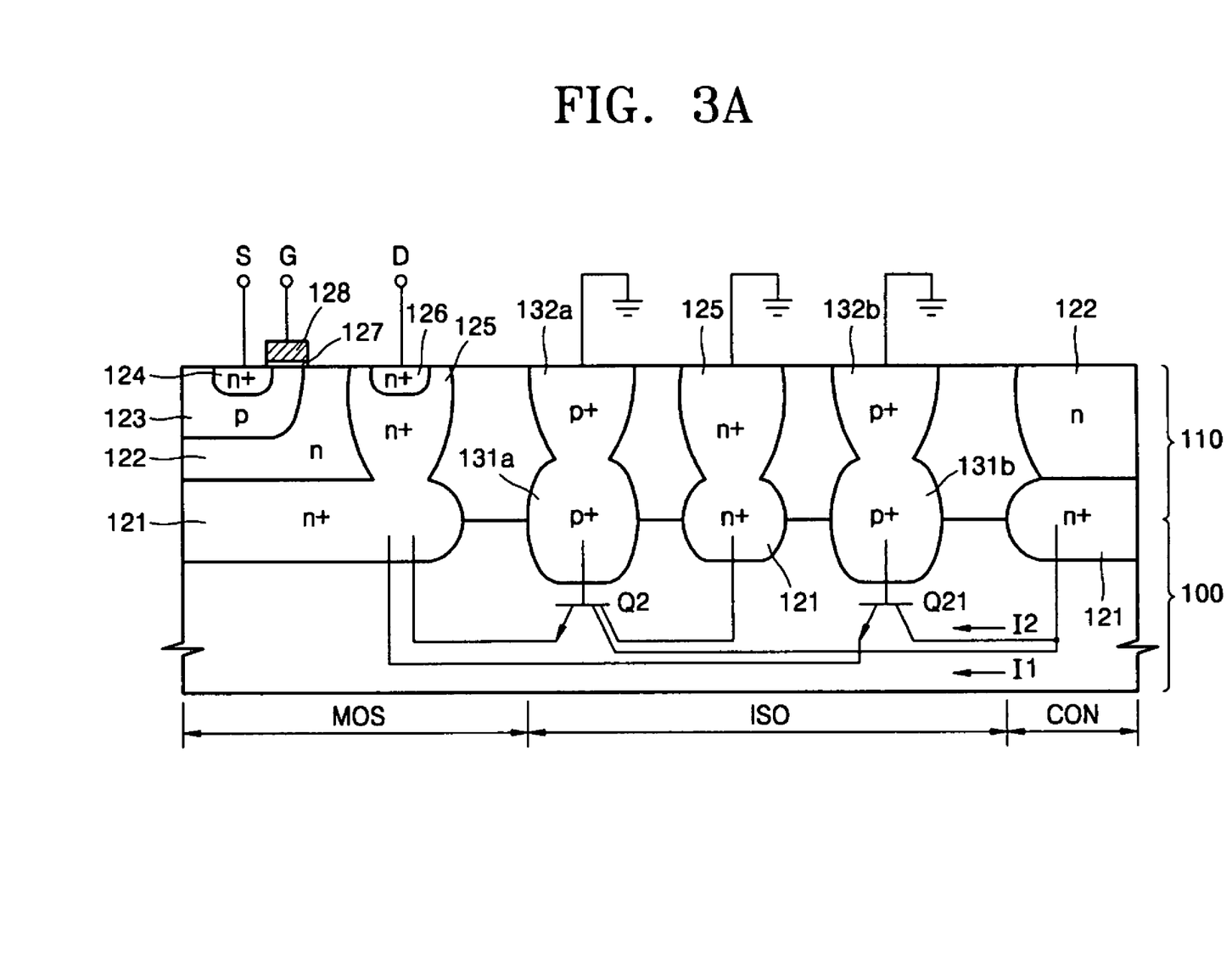
FIG. 3A is a sectional view illustrating another example of the transistor structure of FIG. 2B.
Figure 3B:
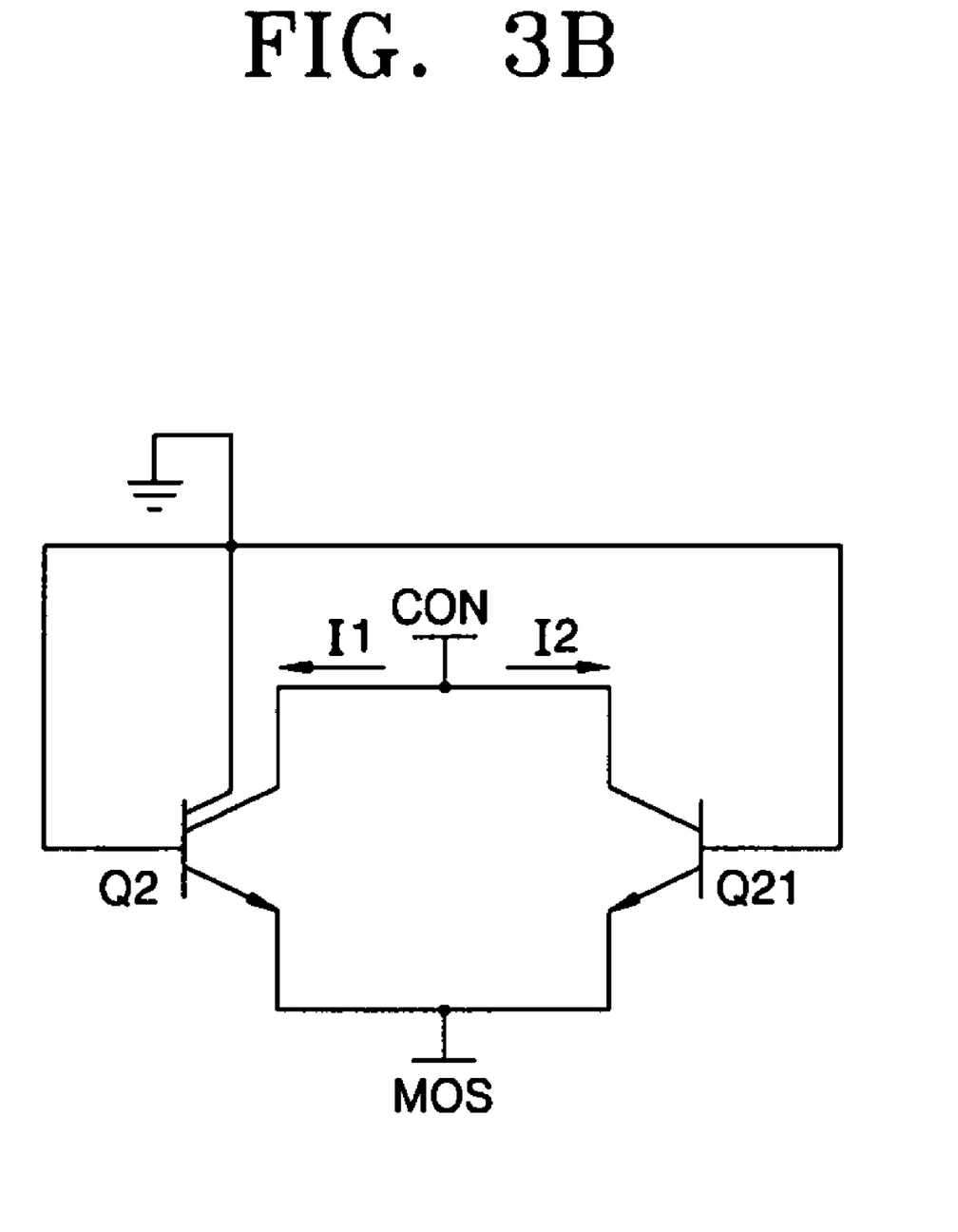
FIG. 3B is an equivalent circuit diagram of a parasitic transistor in the transistor structure of FIG. 3A.

FIG. 3A is a sectional view illustrating another example of the transistor structure of FIG. 2B. FIG. 3B is an equivalent circuit diagram of a parasitic transistor in the transistor structure of FIG. 3A. In FIGS. 2A, 2B and 3A, the same reference numerals denote the same elements.

Referring to FIG. 3A, the first and the second p⁺ type bottom layers 131a and 131b are separated from each other in the isolating unit ISO. An n⁺ type buried layer 121 is arranged between the bottom layers 131a and 131b. The first p⁺ type isolation region 132a is arranged on the first p⁺ type bottom layer 131a, and the second p⁺ type isolation region 132b is arranged on the second p⁺ type bottom layer 131b. Further, the n⁺ type sink region 125 is arranged on the n⁺ type buried layer 121. The first p⁺ type isolation region 132a, the second p⁺ type isolation region 132b, and the n⁺ type sink region 125 are connected to the ground terminal.

In the aforementioned structure, there are two npn type parasitic bipolar junction transistors Q2 and Q21. The first npn type parasitic bipolar junction transistor Q2 is almost equal to the npn type parasitic bipolar junction transistor Q1 of FIG. 2B, except that a collector region is connected to the n⁺ type buried layer 121 and the n type well region 122 of the control unit CON as well as the n⁺ type buried layer 121 and the n⁺ type sink region 125 of the isolating unit ISO. The second npn type parasitic bipolar junction transistor Q21 includes: the second p⁺ type bottom layer 131b and the second p⁺ type isolation region 132b of the isolating unit ISO as a base; the n⁺ type buried layer 121 and the n⁺ type sink region 125 of the control unit CON as a collector; and the n⁺ type buried layer 121, the n⁺ type sink region 125, and the n⁺ type drain region 126 of the transistor unit MOS as an emitter.

Referring to FIG. 3B, an equivalent circuit consisting of the npn parasitic bipolar junction transistors Q2 and Q21 are shown. Now with reference to FIGS. 3A and 3B, the substrate recirculation current flowing to the transistor unit MOS through the first npn type parasitic bipolar junction transistor Q2 comprises a current I1 from the control unit CON and currents from the n⁺ type buried layer 121 and n⁺ type sink region 125 of the isolating unit ISO. Unlike the case of FIG. 2B where only a current from the control unit CON is applied to the transistor unit MOS, the amount of current I1 applied from the control unit CON decreases.

However, although the current I1 applied from the control unit CON decreases, the current I1 applied from the control unit CON still flows to the transistor unit MOS through the first npn type parasitic bipolar junction transistor Q2. In order to further reduce the current I1 applied from the control unit CON to the transistor unit MOS, the number of the isolation regions 132a and 132b in the isolating unit ISO and the n⁺ type sink region 125 should be increased. However, there is a problem in that this requires more area in order to accommodate the increased number of elements. Further, since the current applied from the control unit CON additionally flows to the transistor unit MOS through the second npn type parasitic bipolar junction transistor Q21, there is a problem in that the elements in the control unit CON may result in abnormal operations.

Figure 4:
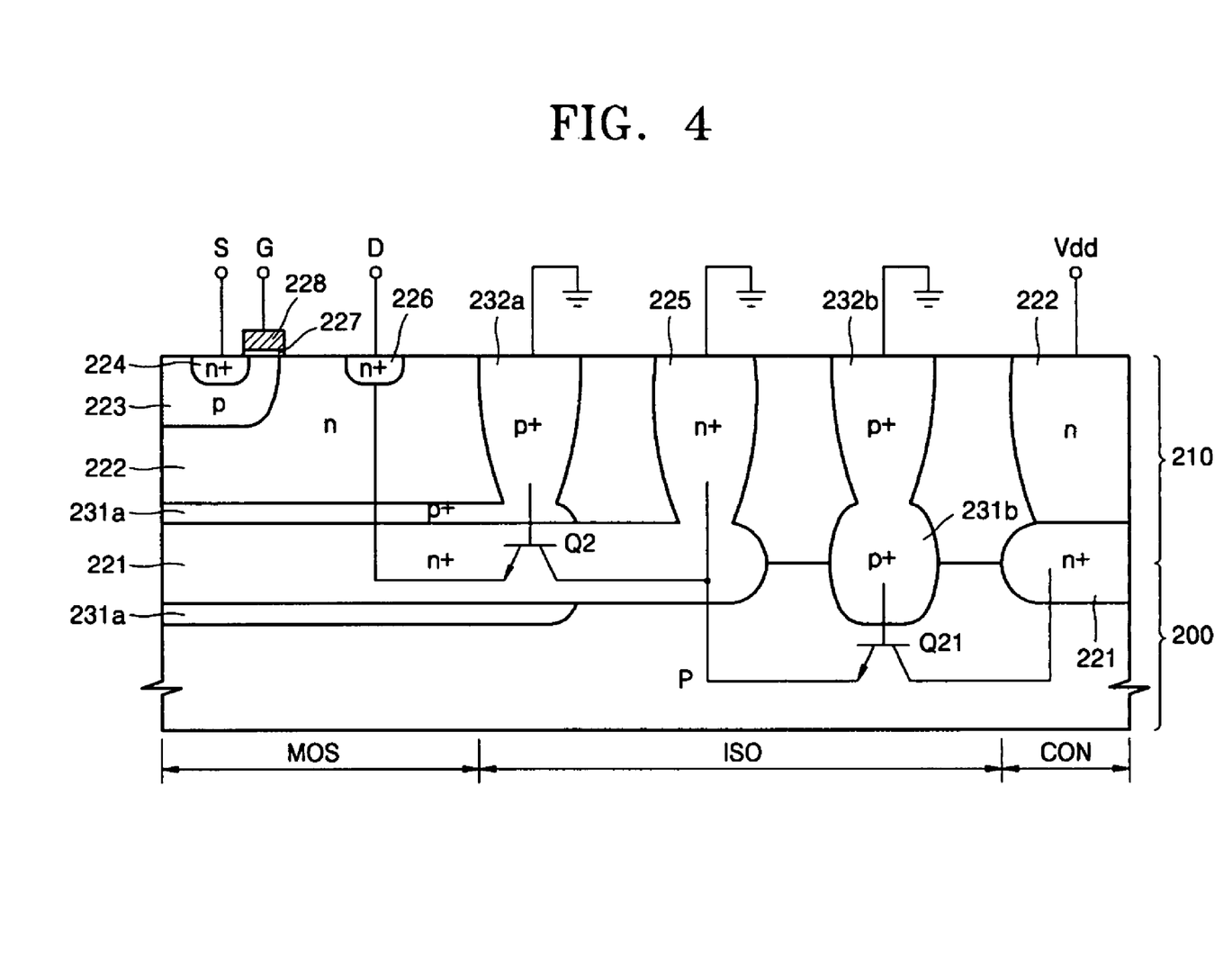
FIG. 4 is a sectional view illustrating an exemplary structure for a power semiconductor device for suppressing a substrate recirculation current, according to an embodiment of the present invention.
Figure 5:
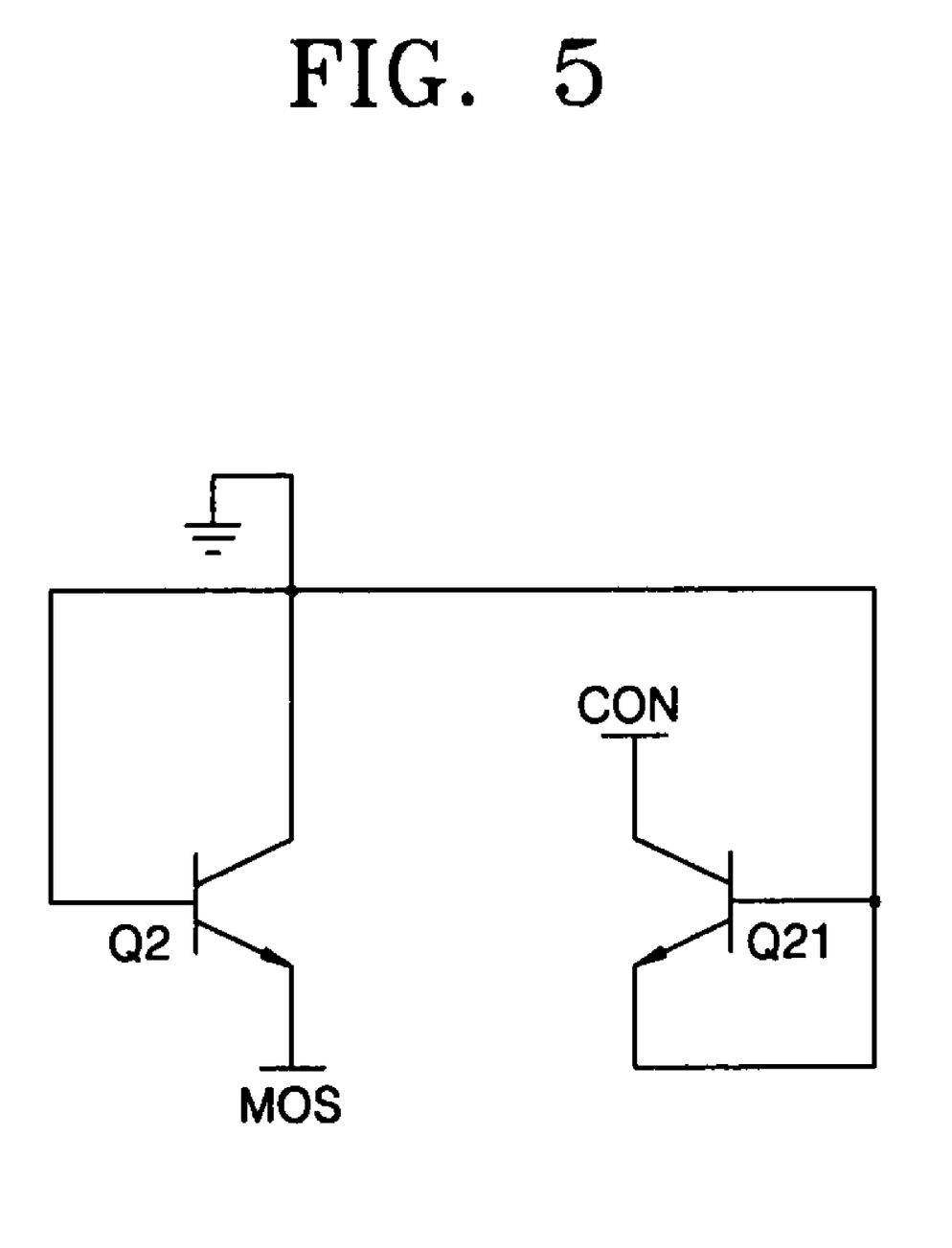
FIG. 5 is an equivalent circuit diagram of a parasitic transistor in the power semiconductor device of FIG. 4, according to an embodiment of the present invention.

FIG. 4 is a sectional view illustrating an exemplary structure for a power semiconductor device for suppressing a substrate recirculation current, according to an embodiment of the present invention, and FIG. 5 is an equivalent circuit diagram of a parasitic transistor in the exemplary structure for the power semiconductor device of FIG. 4.

Referring to FIG. 4, an epitaxial layer 210 is arranged on a p⁻ type substrate 200 having a transistor unit MOS, an isolating unit ISO, and a control unit CON. A DMOS (double diffused MOS) transistor is formed in the transistor unit MOS. Control elements are formed in the control unit CON. A junction isolation region for isolating the transistor unit MOS from the control unit CON is formed in the isolating unit ISO. An n⁺ type buried layer 221 and a p⁺ type bottom layer 231a and 231b are arranged on a junction portion of the p⁻ type substrate 200 and the epitaxial layer 210. The n⁺ type buried layer 221 is formed over the transistor unit MOS and extends a predetermined distance to the adjacent isolating unit ISO. Further, the n⁺ type buried layer 221 is also formed in the control unit CON. The first p⁺ type bottom layer 231a is formed over the transistor unit MOS and extends a predetermined distance to the adjacent isolating unit ISO. The first p⁺ type bottom layer 231a in the transistor unit MOS and the isolating unit ISO are arranged to cover both the top side and the bottom side of the n⁺ type buried layer 221. The second p⁺ type bottom layer 231b is formed in the isolating unit ISO. The second p⁺ type bottom layer 231b in the isolating unit ISO is separated by a predetermined distance from the n⁺ type buried layer 221 extending from the transistor unit MOS to the isolating unit ISO. Further, the second p⁺ type bottom layer 231b in the isolating unit ISO is separated by a predetermined distance from the n⁺ type buried layer 221 in the control unit CON.

In the transistor unit MOS, an n type well region 222 is arranged on the first p⁺ type bottom layer 231a. A p type body region 223 and an n⁺ type drain region 226 are separately arranged in a region on the n type well region 222. An n⁺ type source region 224 is arranged in a region on the p type body region 223. A gate insulating layer 227 and a gate conductive layer 228 are sequentially arranged on a channel forming region of the p type body region 223 surrounding the n⁺ type source region 224. The n⁺ type source region 224, the n⁺ type drain region 226, and the gate conductive layer 228 are connected to a source terminal S, a drain terminal D, and a gate terminal G through metal interconnection lines, respectively.

In the isolating unit ISO, the first p⁺ type isolation region 232a is arranged on the first p⁺ type bottom layer 231a. A bottom of the first p⁺ type isolation region 232a makes contacts with a top of the first p⁺ type bottom layer 231a. The first p⁺ type isolation region 232a is connected to a ground terminal. An n⁺ type region 225 is arranged on the n⁺ type buried layer 221 extending from the transistor unit MOS. A bottom of the n⁺ type region 225 makes contacts with a top of the n⁺ type buried layer 221. The n⁺ type region 225 is connected to the ground terminal. The second p⁺ type isolation region 232b is arranged on the second p⁺ type bottom layer 231b, separated by a predetermined distance from the n⁺ type buried layer 221. A bottom of the second p⁺ type isolation region 232b contacts with a top surface of the second p⁺ type bottom layer 231b. The second p⁺ type isolation region 232b is connected to the ground terminal.

In the control unit CON, the n type well region 222 is arranged on the n⁺ type buried layer 221. Although not shown in the drawings, several diffusion regions constituting the control element may be arranged in the n type well region 222. The n type well region 222 is connected to a bias voltage (Vdd) terminal.

Referring to FIG. 5, in the element, there are the first npn type parasitic bipolar junction transistor Q2 and the second npn type parasitic bipolar junction transistor Q21. The base and the collector of the first npn type parasitic bipolar junction transistor Q2 are grounded, and the emitter thereof is connected to the transistor unit MOS. The base and the emitter of the second npn type parasitic bipolar junction transistor Q21 are grounded, and the collector thereof is connected to the control unit CON.

Referring to FIGS. 4 and 5, the base of the first npn type parasitic bipolar junction transistor Q2 is grounded through the first $p^+$ type isolation region 232$a$ of the isolating unit ISO. The collector thereof is grounded through the $n^+$ type buried layer 221 and the $n^+$ type region 225 of the isolating unit ISO. The emitter thereof is connected to the drain terminal D of the transistor unit MOS through the $n^+$ type buried layer 221, the n type well region 222, and the $n^+$ type drain region 226. Although the $n^+$ type buried layer 221 and the n type well region 222 are electrically separated by the first $p^+$ type bottom layer 231$a$ in the transistor unit MOS as shown in the drawings, the $n^+$ type buried layer 221 and the n type well region 222 may actually make contact with other portions (not explicitly shown). Next, the base of the first npn type parasitic bipolar junction transistor Q21 is grounded through the $p^-$ type substrate 200, the second $p^+$ type bottom layer 231$b$ and the second $p^+$ type isolation region 232$b$ of the isolating unit ISO. The collector is connected to the bias voltage (Vdd) terminal through the $n^+$ type buried layer 221 and the n type well region 222 of the control unit CON. The emitter is grounded through the $n^+$ type buried layer 221 and the $n^+$ type region 225 in the isolating unit ISO.

The first npn type parasitic bipolar junction transistor Q2 operates when a voltage applied to the drain terminal D becomes lower than that of the ground terminal. As a result, a current flows from the $n^+$ type buried layer 221 and the $n^+$ type region 225 of the isolating unit ISO to the drain terminal D through the n type well region 222 and the $n^+$ type drain region 226 of the transistor unit MOS. The first npn type parasitic bipolar junction transistor Q2 does not influence a current in the control unit CON because the first npn type parasitic bipolar junction transistor Q2 is electrically separated from the control unit CON. Further, since the base and the emitter of the second npn type parasitic bipolar junction transistor Q21 are connected to the ground terminal, the second npn type parasitic bipolar junction transistor Q21 serves as a diode having the $n^+$ type buried layer 221 of the control unit CON as a cathode and the $p^-$ type substrate 200 as an anode. Since the cathode of this diode is connected to the bias voltage (Vdd) terminal and the anode is connected to the ground terminal, a reverse bias is applied to the diode, so that the diode does not turn on. As a result, even if the first npn type parasitic bipolar junction transistor Q2 is in operation, the first npn type parasitic bipolar junction transistor Q2 does not influence the current of the control unit CON.

Figure 6:
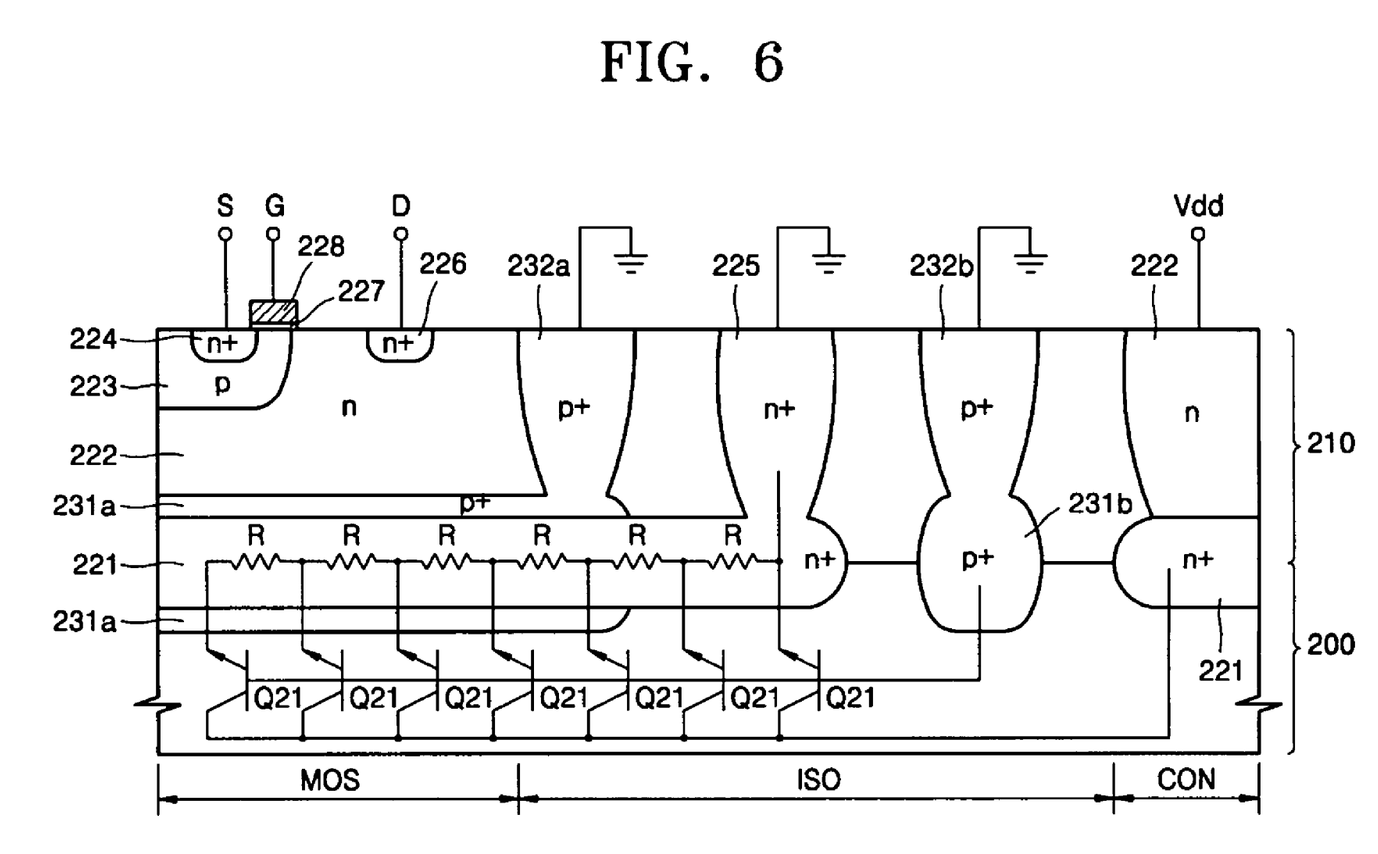
FIG. 6 is a sectional view illustrating exemplary parasitic transistors and resistors in the power semiconductor device of FIG. 4.

FIG. 6 is a sectional view illustrating exemplary parasitic transistors and resistors in the power semiconductor device of FIG. 4. In FIGS. 4 and 6, the same reference numerals denote the same elements.

The second npn type bipolar junction transistor Q21 may have a structure in which several transistors are connected in series, which may be along the horizontal direction. A resistance R is arranged in the $n^+$ type buried layer 221 in the horizontal direction between collectors of the second npn type bipolar junction transistors Q21. Although ideally the resistance R can be ignored, in actuality the resistance R should not be taken into account according to the impurity density of the $n^+$ type buried layer 221. When the resistance R is over a predetermined value, a forward bias due to voltage drop caused by the resistance R may be applied to the diode formed with the second npn parasitic bipolar junction transistor Q21. As a result, a current flows from the control unit CON through the second npn parasitic bipolar junction transistor Q21. The resistances should be maintained under a predetermined value. Therefore, the resistance should have an impurity density which is higher than a predetermined amount. In one embodiment, the impurity density of the $n^+$ type buried layer 221 is adjusted within a range of about $1 \times 10^{19}/cm^3$ to $9 \times 10^{19}/cm^3$. But the impurity density may be higher when the bias voltage (Vdd) of the control unit CON becomes 5V or less.

Figure 7:
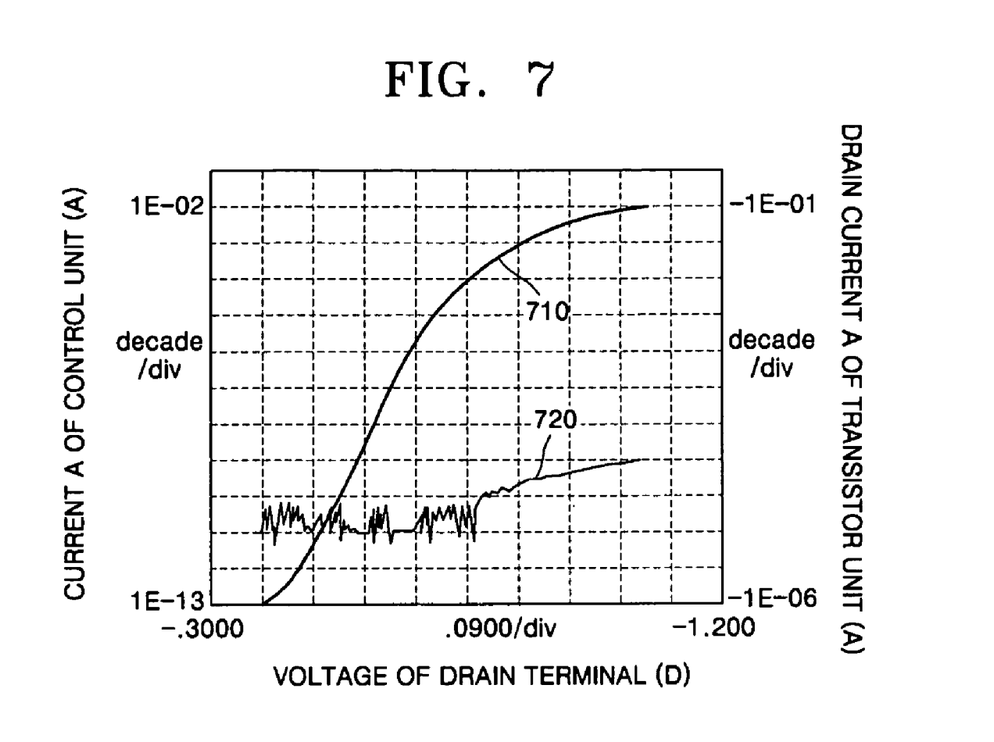
FIG. 7 is a graph illustrating exemplary current-voltage characteristics of a drain current and a current of the control unit CON to a drain voltage in the power semiconductor device of FIG. 4.

FIG. 7 is a graph illustrating exemplary current-voltage characteristics of a drain current and a current of the control unit CON to a drain voltage in the power semiconductor device of FIG. 4.

As indicated by a line 710, a drain current of the transistor unit MOS increases by operation of the first npn type parasitic bipolar junction transistor Q2 as already described when a voltage of the drain terminal D becomes higher negatively. As indicated by a line 720, a current of the control unit CON may have a relatively low value of, for example, about $1 \times 10^{10}$ A (that is, 10 nA), because an operation of the first npn type parasitic bipolar junction transistor Q2 does not influence the current of the control unit CON, and the second npn type parasitic bipolar junction transistor Q21 does not turn on.

Figure 8:
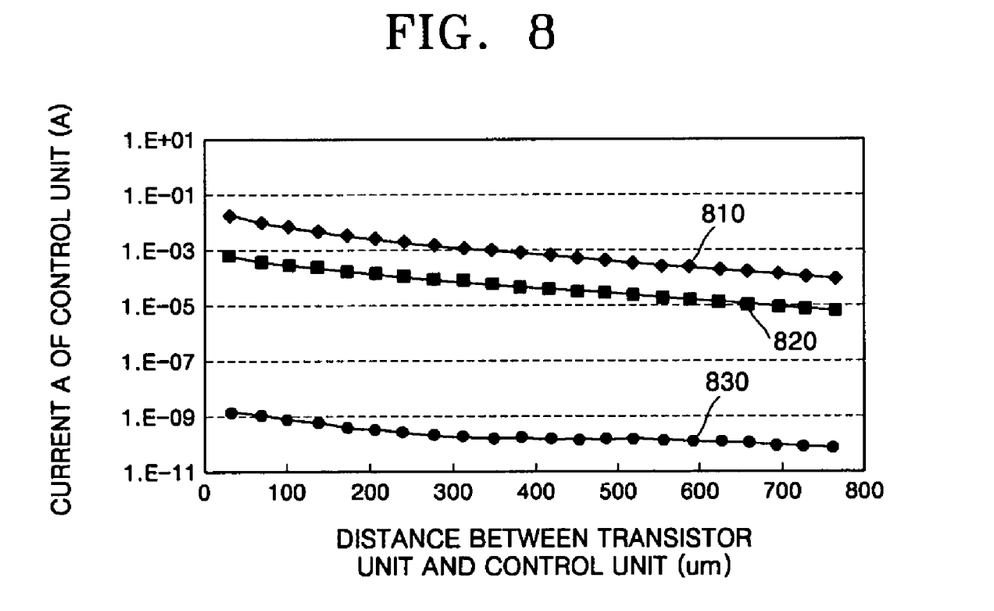
FIG. 8 is a graph illustrating an exemplary current characteristic in the control unit CON depending on a distance between a power transistor unit MOS and a control unit CON in the power semiconductor device of FIG. 4, and in comparison with a conventional case.

FIG. 8 is a graph illustrating an exemplary current characteristic in the control unit CON depending on a distance between a power transistor unit MOS and a control unit CON in the power semiconductor device of FIG. 4, and in comparison with a conventional case.

As indicated by a line 810, the power semiconductor device of FIG. 2B has the highest value in a current of the control unit CON. When a distance between the transistor unit MOS and the control unit CON increases, the current value of the control unit CON decreases. Next, as indicated by a line 820, the power semiconductor device of FIG. 3A has a smaller current value than the power semiconductor device of FIG. 2B. The current value of the control unit CON decreases, but the amount of decrease is small, so that it cannot have a large effect. When the distance between the transistor unit MOS and the control unit CON increases, the current value of the control unit CON decreases. In the power semiconductor device according to an embodiment of the present invention, as indicated by a line 830, the current of the control unit CON is lower than the power semiconductor devices of FIGS. 2B and 3A. In the power semiconductor device according to one embodiment of the present invention, when the distance between the transistor unit MOS and the control unit CON increases, the current value of the control unit CON decreases. However, the current value of the control unit CON in the exemplary power semiconductor device according to one embodiment of the present invention (where the distance between the transistor unit MOS and the control unit CON is 100 μm or less) is much less than the current value of the control unit CON in conventional power semiconductor devices (where the distance between the transistor unit MOS and the control unit CON is 700 μm or more). Therefore, it can be understood that the exemplary power semiconductor device according to one embodiment of the present invention provides a larger effect in an integrated element.

FIGS. 9 to 12 are sectional views illustrating an exemplary method of fabricating the power semiconductor device, according to an embodiment of the present invention.

Figure 9:
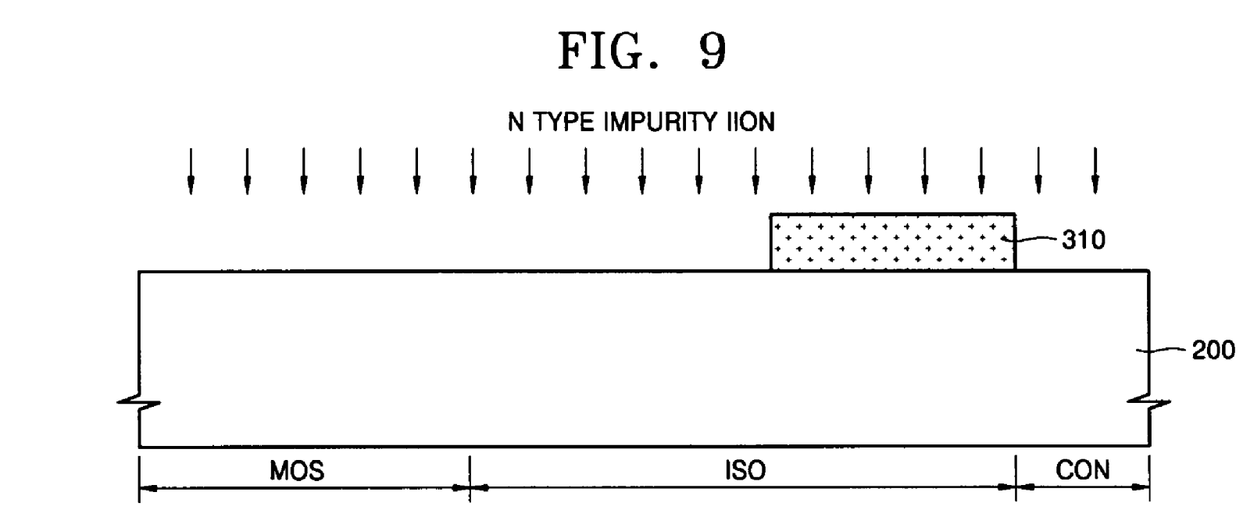
FIGS. 9 to 12 are sectional views illustrating an exemplary method of fabricating a power semiconductor device, according to an embodiment of the present invention.

First, referring to FIG. 9, a transistor unit MOS, an isolating unit ISO, and a control unit CON may be sequentially disposed on a p⁻ type substrate 200 in a horizontal direction. A mask layer pattern 310, for example, a photoresist layer pattern, is formed on the p⁻ type substrate 200. The photoresist layer pattern 310 covers some portions of the isolating unit ISO. Portions exposed by the photoresist layer pattern 310 are to be n⁺ type buried layers. As indicated by arrows in the drawings, n type impurity ions may be implanted with an ion implanting process using the photoresist layer pattern 310 as an ion implanting mask. Arsenide (As) ions and antimony (Sb) ions, which have a relatively good diffusion property, may be used as the n type impurity ions.

Figure 10:
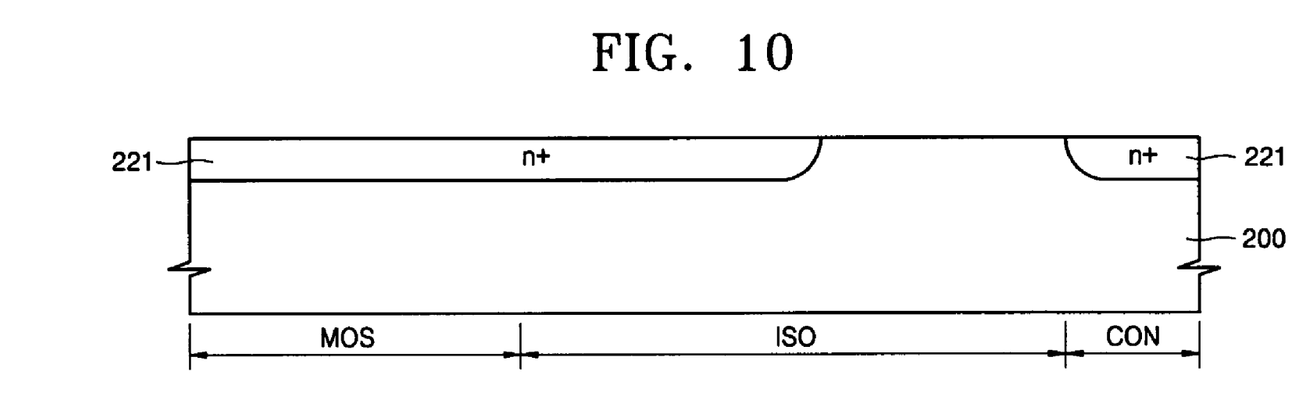

Next, referring to FIG. 10, the photoresist layer pattern 310 of FIG. 9 is removed. The implanted n type impurity ions may be diffused with a general impurity ion diffusing process. Then, the n⁺ type buried layer 221 is formed in the transistor unit MOS and the control unit CON. As a result, the n⁺ type buried layer 221 extending from the transistor unit MOS is formed by a predetermined distance in the isolating unit ISO.

Figure 11:
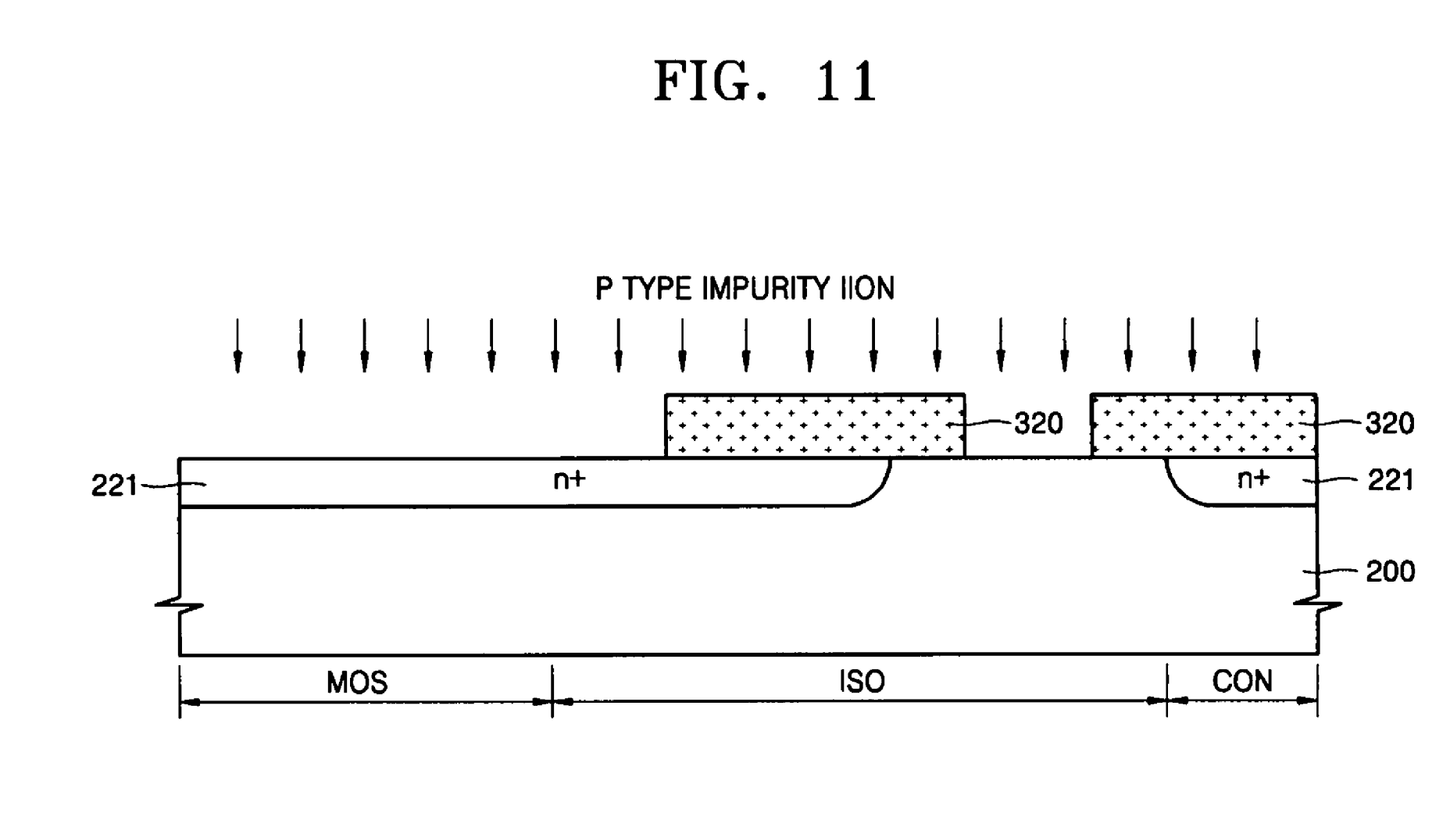

Next, referring to FIG. 11, a mask layer pattern 320, for example, a photoresist layer pattern, is again formed on the p⁻ type substrate 200. By the photoresist layer pattern 320, the surface of the transistor unit MOS and some portions of the isolating unit ISO are exposed, and the surface of the control unit CON is covered. In the isolating unit ISO, the n⁺ type buried layer 221 is covered and the surface, where there are not n⁺ type buried layers 221, is exposed. Next, as indicated by arrows in the drawings, p type impurity ions are implanted with the ion implanting process using the photoresist layer pattern 320 as an ion implanting mask. Boron (B) ions may be used as the p type impurity ions. Next, the photoresist layer pattern 320 is removed.

Figure 12:
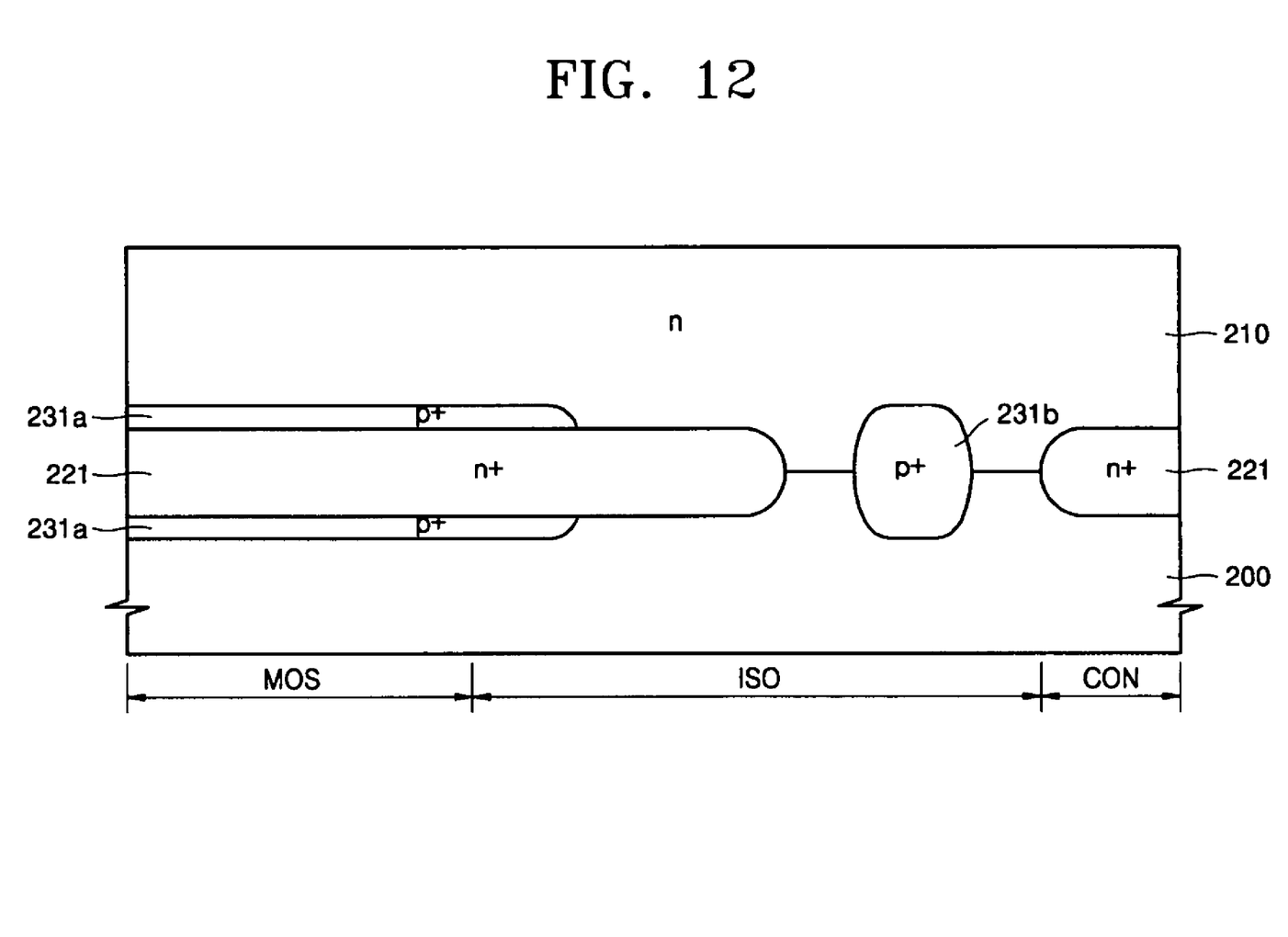

Next, as shown in FIG. 12, the p type impurity ions implanted with a general impurity ion diffusing process are diffused. The n type epitaxial layer 210 may then be formed with an epitaxial growing process. Alternatively, the process of diffusing the p type impurity ions may be omitted, and the p type impurity ions implanted for epitaxial growth may be diffused with a heat treatment. In the transistor unit MOS, when the epitaxial growing process ends, the first p⁺ type bottom layer 231a may be formed on a top and a bottom of the n⁺ type buried layer 221, and the first p⁺ type bottom layer 231a extends to a region of the isolating unit ISO adjacent to the transistor unit MOS. In the isolating unit ISO, the second p⁺ type bottom layer 231b is formed by a predetermined distance from the n⁺ type buried layer 221.

Next, as shown in FIG. 4, after forming the n type well region 222 with a general process, the DMOS transistor element is formed in the transistor unit MOS. The first and second p⁺ type isolation regions 232a and 232b and the n⁺ type region 225 may be formed in the isolating unit ISO. The first p⁺ type isolation region 232a can be formed to make contact with an upper portion (or top) of the first p⁺ type bottom layer 231a. The n⁺ type region 225 is formed to contact with an upper portion of the n⁺ type buried layer 221. The second p⁺ type isolation region 232b is formed to make contact with a top of the second p⁺ type bottom layer 231b. Therefore, as shown in the drawings, in an exemplary power semiconductor device, the first npn type parasitic bipolar junction transistor Q2 can be electrically separated from the control unit CON.

As described above, in an exemplary power semiconductor device according to an embodiment of the present invention, a current from the control unit CON into a substrate by switching the power semiconductor device can be suppressed even in operations of a parasitic bipolar junction transistor by electrically separating the parasitic bipolar junction transistor from the control unit CON. In addition, a characteristic change or a malfunction of the control unit CON caused by operating the parasitic bipolar junction transistor can be prevented. Further, in, a method of fabricating the exemplary power semiconductor device according to an embodiment of the present invention, it is possible to obtain a power semiconductor device having the above structure using a general process without significantly increasing the number of masks.

While the present invention has been particularly shown and described with reference to exemplary embodiments thereof, it will be understood by those skilled in the art that various changes in form and details may be made therein without departing from the spirit and scope of the invention as defined by the appended claims. The exemplary embodiments should be considered in descriptive sense only and not for purposes of limitation. Therefore, the scope of the invention is defined not by the detailed description of the invention but by the appended claims, and all differences within the scope will be construed as being included in the present invention.

What is claimed is:

1. A method of fabricating a power semiconductor device comprising a first region in which a transistor is formed, a third region in which a control element is formed, and a second region arranged between the first region and the third region to electrically separate the transistor from the control element, the method comprising:

forming a first mask layer pattern covering a partial surface of the second region adjacent to the third region on a substrate of a first conductive type;

implanting impurity ions of a second conductive type on the substrate with a first ion implantation process using the first mask layer pattern as an ion implantation mask;

forming a highly-doped buried layer of a second conductive type arranged in the first region and the third region and extending to the second region from the first region by removing the first mask layer pattern and diffusing the implanted impurity ions;

forming a second mask layer pattern to expose a surface of the first region and a surface of a portion where the highly-doped buried layer is not formed in the second region, on the substrate;

implanting impurity ions of a first conductive type on the substrate with the second ion implantation process using the second mask layer pattern as an ion implantation mask;

forming a first highly-doped bottom layer of a first conductive type arranged in the first region and the third region and extending to the second reigon from the first region by removing the first mask layer pattern and diffusing the implanted impurity ions and a second highly-doped bottom layer of the first conductive type separated from the highly-doped buried layer in the second region; and forming a semiconductor region on the substrate.

2. The method of fabricating a power semiconductor device according to claim 1, wherein an arsenide (As) or antimony (Sb) ion is used as the impurity ion of the second conductive type.

3. The method of fabricating a power semiconductor device according to claim 1, wherein a boron (B) ion is used as the impurity ion of the first conductive type.

4. The method of fabricating a power semiconductor device according to claim 1, wherein the impurity density of the impurity ion of the second conductive type is in a range of $1 \times 10^{19}/cm^3$ to $9 \times 10^{19}/cm^3$.

5. The method of fabricating a power semiconductor device according to claim 1, further comprising the forming of the first highly-doped isolation region of a first conductive type to contact an upper portion of the first highly-doped bottom layer of the first conductive type and the second highly-doped isolation region of the first conductive type to contact an upper portion of the second highly-doped bottom layer of the first conductive type in the second region; and forming the highly-doped region of a second conductive type to contact an upper portion of the highly-doped buried layer of the second conductive type in the second region.

6. The method of fabricating a power semiconductor device according to claim 1, wherein the first conductive type is p type, and the second conductive type is n type.

* * * * *